(12) United States Patent
Shin

(10) Patent No.: US 7,968,421 B2
(45) Date of Patent: Jun. 28, 2011

(54) METHOD FOR MANUFACTURING SOI STRUCTURE IN DESIRED REGION OF A SEMICONDUCTOR DEVICE

(75) Inventor: Min Jung Shin, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 245 days.

(21) Appl. No.: 12/332,555

(22) Filed: Dec. 11, 2008

(65) Prior Publication Data

US 2009/0186463 A1    Jul. 23, 2009

(30) Foreign Application Priority Data

Jan. 18, 2008   (KR) .......................... 10-2008-0005903

(51) Int. Cl.
*H01L 21/76* (2006.01)
(52) U.S. Cl. ........ 438/424; 438/425; 438/435; 438/439; 257/E21.54; 257/E21.206; 257/E21.545
(58) Field of Classification Search .................. 438/424, 438/425, 435, 439, FOR. 221, FOR. 227; 257/E21.54, E21.206, E21.545
See application file for complete search history.

(56) References Cited

U.S. PATENT DOCUMENTS

| 7,157,350 | B2 * | 1/2007 | Yang et al. | 438/424 |
| 7,442,618 | B2 * | 10/2008 | Chong et al. | 438/424 |
| 2007/0032037 | A1 * | 2/2007 | Yang et al. | 438/424 |

FOREIGN PATENT DOCUMENTS

| KR | 10-0688547 B1 | 3/2007 |
| KR | 10-0772709 B1 | 11/2007 |

\* cited by examiner

*Primary Examiner* — Michelle Estrada
(74) *Attorney, Agent, or Firm* — Ladas & Parry LLP

(57) ABSTRACT

Manufacturing a semiconductor device includes defining bulb-type trenches having spherical portions in a silicon substrate. Oxide layers are formed in surfaces of spherical portions of the bulb-type trenches by conducting an oxidation process for the silicon substrate having the bulb-type trenches defined therein. An insulation layer is formed on the entire surface of the silicon substrate including the surfaces of the bulb-type trenches, which have the oxide layers formed in the surfaces of the spherical portions thereof. Isolation trenches are defined by etching the insulation layer, whereby SOI structures having the oxide layers interposed between portions of the silicon substrate are formed.

17 Claims, 4 Drawing Sheets

METHOD FOR MANUFACTURING SOI STRUCTURE IN DESIRED REGION OF A SEMICONDUCTOR DEVICE

CROSS-REFERENCE TO RELATED APPLICATIONS

The present application claims priority to Korean patent application number 10-2008-0005903 filed on Jan. 18, 2008, which is incorporated herein by reference in its entirety.

BACKGROUND OF THE INVENTION

The present invention relates generally to a method for manufacturing a semiconductor device, and more particularly, to a method for manufacturing a semiconductor device capable of forming an silicon-on-insulator (SOI) structure only in a desired region.

In the semiconductor industry, trends in the development of semiconductor devices are leading to devices having high integration, high speed operation and low power consumption Realizing a desired operation within a decreased area is necessary to achieve these semiconductor devices. A capacitorless memory device has recently been mentioned as having promise in the semiconductor industry. A capacitorless memory device can store and read out data by charging up a plurality of carriers in a floating body and changing the threshold voltage of a cell.

A typical capacitorless memory device is realized using an SOI substrate, which has a stack structure of a silicon substrate, a buried oxide layer and a silicon layer. Advantages of capacitorless memory devices include: the ability to accomplish high speed operation by a small junction capacitance that is less than that of a typical dynamic random access memory (DRAM), voltage reduction as a result of a low threshold voltage, and prevention of a latch-up phenomenon as a result of complete isolation.

However, although the capacitorless memory device realized on the SOI substrate has the above-described advantages, side effects, such as a floating body effect, are likely to be caused.

In detail, in a capacitorless memory device realized on an SOI substrate, electron holes continuously accumulate in the low potential area of the body of a floating transistor, that is, the lower portion of the boundary area between a source region and a channel region. When the electron holes accumulate in this manner, the potential of the channel increases, the threshold voltage decreases, and the drain voltage-current characteristics of the transistor change as observed in a kink effect.

Additionally, depending upon the use of the semiconductor device, there may be one case in which it is advantageous to realize the semiconductor device on an SOI device even though a floating body effect is caused, and then another case in which the floating body effect causes problems.

SUMMARY OF THE INVENTION

Embodiments of the present invention are directed to a method for manufacturing a semiconductor device which can selectively form an SOI structure only in a desired region so that the semiconductor device having a semiconductor substrate with a selectively formed SOI structure is suitable for various purposes.

In one aspect of the present invention, a method for manufacturing a semiconductor device includes the steps of defining bulb-type trenches in a silicon substrate; forming oxide layers in surfaces of spherical portions of the bulb-type trenches by conducting an oxidation process for the silicon substrate defined with the bulb-type trenches; forming an insulation layer on the entire surface of the silicon substrate including surfaces of the bulb-type trenches formed to have the oxide layers on the surfaces of the spherical portions thereof; and defining isolation trenches by etching the insulation layer and forming SOI structures such that the oxide layers are interposed between portions of the silicon substrate.

The step of defining the bulb-type trenches in the silicon substrate comprises the steps of forming hard mask patterns on the silicon substrate such that isolation areas are exposed; defining trenches by etching the exposed isolation areas of the silicon substrate; forming an etch barrier layer on both sidewalls of the trenches; and isotropically etching portions of the silicon substrate which constitute bottoms of the trenches using the etch barrier layer and the hard mask patterns as an etch mask.

The hard mask patterns can comprise a stack of an oxide layer and a nitride layer.

The etch barrier layer can comprise a nitride layer.

The oxidation process is conducted such that the oxide layers formed in the surfaces of the spherical portions of adjoining bulb-type trenches come into contact with each other or overlap each other.

The insulation layer is formed to a thickness capable of filling the spherical portions of the bulb-type trenches.

The insulation layer can comprise an oxide layer.

The etching of the insulation layer is conducted as anisotropic etching.

After the step of defining the isolation trenches and forming the SOI structures, the method further comprises the step of forming isolation structures by filling an insulation layer in the isolation trenches.

In another aspect of the present invention, a method for manufacturing a semiconductor device comprises the steps of defining first and second trenches in isolation areas of a first region and a second region of a silicon substrate; forming etch barrier layers on sidewalls of the first and second trenches; defining bulb-type third trenches including the first trenches by isotropically etching portions of the silicon substrate which constitute bottoms of the first trenches in the first region; forming oxide layers in surfaces of spherical portions of the bulb-type third trenches by conducting an oxidation process for the silicon substrate defined with the bulb-type third trenches in the first region; forming an insulation layer on an entire surface of the silicon substrate including the bulb-type third trenches of the first region and the second trenches of the second region; and defining isolation trenches in the first region and the second region by etching the insulation layer and forming SOI structures such that the oxide layers are interposed between portions of the silicon substrate in the first region.

The first region corresponds to a cell region, and the second region corresponds to a peripheral region.

The step of defining the first trenches and the second trenches in the first region and the second region of the silicon substrate comprises the steps of forming a hard mask layer on the silicon substrate; forming a second hard mask pattern by etching portions of the hard mask layer which are formed in the second region, to expose isolation areas of the second region; etching the exposed isolation areas of the second region; forming first hard mask patterns by etching portions of the hard mask layer which are formed in the first region, to expose isolation areas of the first region; and etching the exposed isolation areas of the first region and etching again the etched isolation areas of the second region.

The hard mask layer can comprise a stack of an oxide layer and a nitride layer.

The second trenches of the second region are defined deeper than the first trenches of the first region.

The etch barrier layers can comprise a nitride layer.

The oxidation process is conducted such that the oxide layers formed in the surfaces of the spherical portions of adjoining bulb-type third trenches come into contact with each other or overlap each other.

The insulation layer is formed to a thickness capable of filling the spherical portions of the bulb-type third trenches.

The insulation layer can comprise an oxide layer.

The etching of the insulation layer is conducted as anisotropic etching.

After the step of defining the isolation trenches in the first region and the second region and forming the SOI structures in the first region, the method further comprises the step of forming isolation structures by filling an insulation layer in the isolation trenches.

DESCRIPTION OF SPECIFIC EMBODIMENT

Hereafter, specific embodiments of the present invention will be described in detail with reference to the accompanying drawings.

FIGS. 1 through 8 are cross-sectional views shown for illustrating the processes of a method for manufacturing a semiconductor device in accordance with an embodiment of the present invention.

Figure 1:
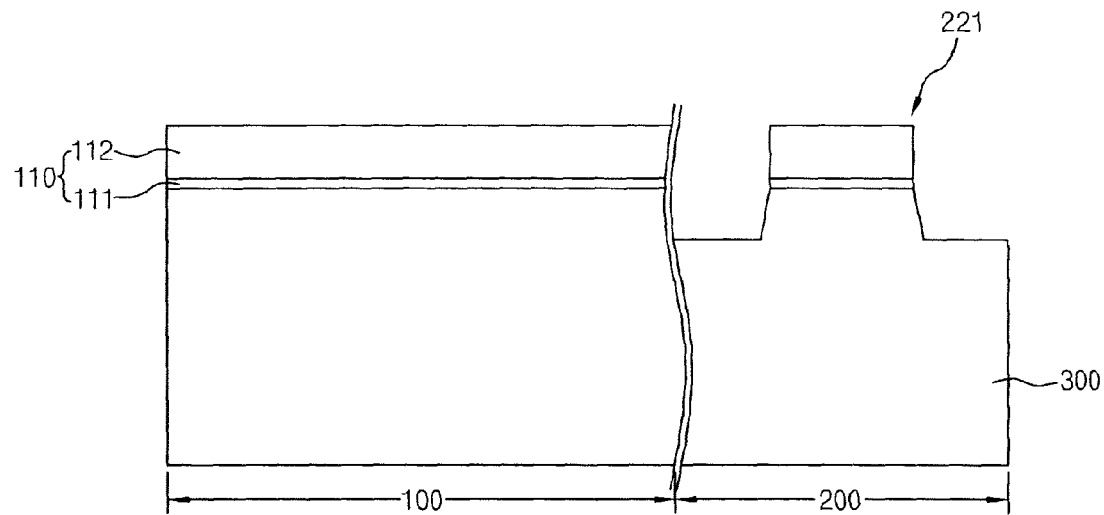
FIGS. 1 through 8 are cross-sectional views shown for illustrating the processes of a method for manufacturing a semiconductor device in accordance with an embodiment of the present invention.

Referring to FIG. 1, a hard mask layer 110 is formed on a silicon substrate 300 which has a first region 100 corresponding to a cell region and a second region 200 corresponding to a peripheral region. The hard mask layer 110 includes a stack of an oxide layer 111 and a nitride layer 112. A second hard mask pattern 221 is formed by etching portions of the hard mask layer 110 formed in the second region 200 in such a way as to expose isolation areas in the second region 200. The exposed areas of the silicon substrate 300 in the second region 200 are then etched using the second hard mask pattern 221 as an etch mask. The etching is conducted to a depth in the range of 500~1,000 Å.

Figure 2:
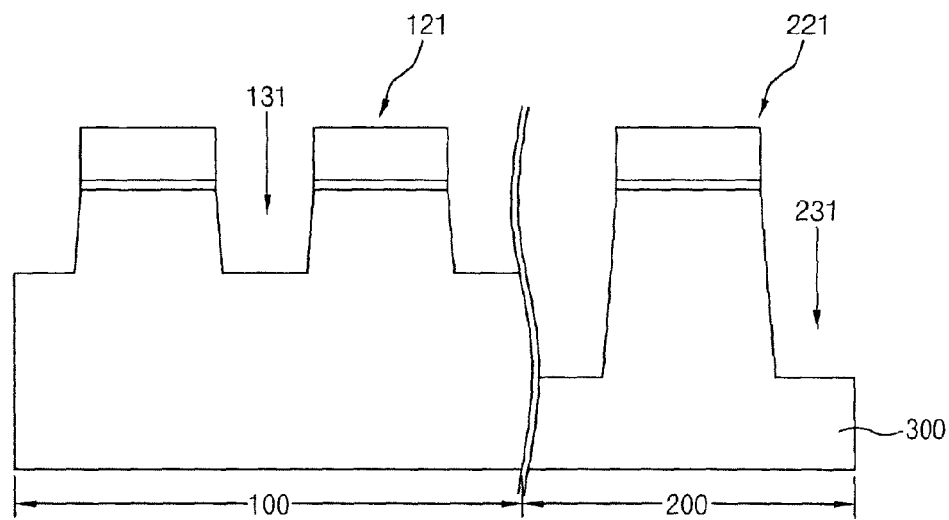

Referring to FIG. 2, first hard mask patterns 121 are formed by etching portions of the hard mask layer 110 in the first region 100 in such a way as to expose isolation areas of the first region 100. By etching the exposed isolation areas of the silicon substrate 300 in the first region 100 using the first hard mask patterns 121 as an etch mask and etching again the isolation areas of the etched silicon substrate 300 in the second region 200 using the second hard mask pattern 221 as an etch mask, first and second trenches 131 and 231 are defined in the isolation areas of the first region 100 and the second region 200. The second trenches 231 of the second region 200 have a depth that is greater than that of the first trenches 131 in the first region 100 because they are formed by conducting etching twice.

Figure 3:
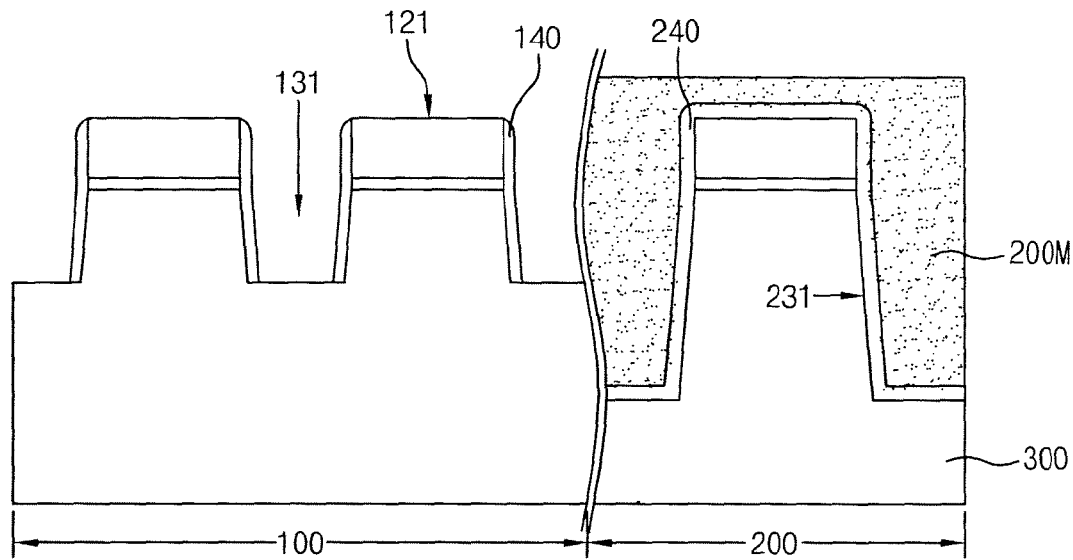

Referring to FIG. 3, etch barrier layers 140 and 240 are formed on the silicon substrate 300 including on surfaces of the first and second trenches 131 and 231. The etch barrier layers 140 and 240 each comprises a nitride layer. A photoresist pattern 200M is formed on the etch barrier layers 140 and 240 in manner such that the first region 100 is exposed. In the exposed first region 100, the portions of the etch barrier layer 140 formed on the upper surfaces of the first hard mask patterns 121 and the bottom surfaces of the first trenches 131 are removed.

Figure 4:
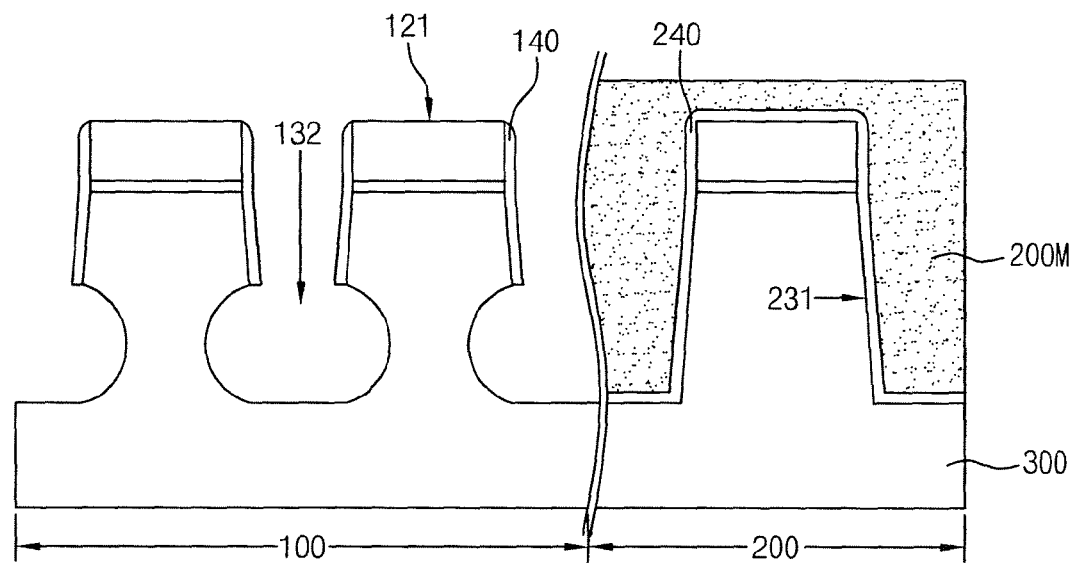

Referring to FIG. 4, the portions of the silicon substrate 300 at the bottoms of the first trenches 131 are etched using both the etch barrier layer 140 remaining on the sidewalls of the first trenches 131 and the first hard mask patterns 121 as an etch mask; and thereby, bulb-type third trenches 132, which include the first trenches 131 and have spherical lower portions, are formed. The etching is conducted through an isotropic etching process such as wet etching.

Figure 5:
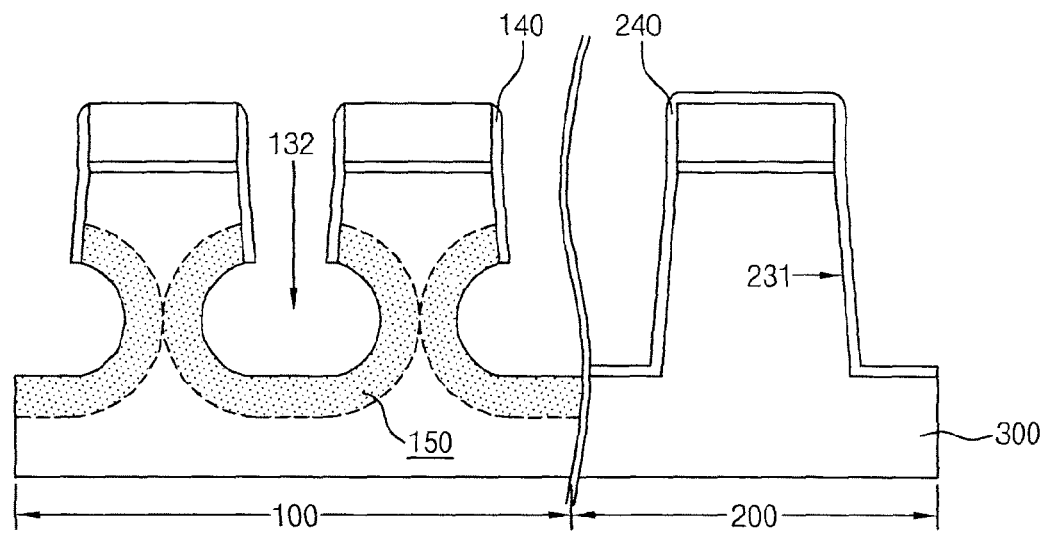

Referring to FIG. 5, the photoresist pattern 200M remaining in the second region 200 is removed through a process well known in the art. An oxidation process is conducted for the resultant silicon substrate 300 which is formed with the bulb-type third trenches 132 in the first region 100, and through this, oxide layers 150 are formed in the surfaces of the spherical lower portions of the bulb-type third trenches 132. At this time, the oxidation process is conducted for a period of time that is sufficient to allow for the oxide layers 150 (which are formed in the surfaces of the spherical lower portions) of adjoining bulb-type third trenches 132 to come into contact with each other or overlap each other. As a result, the portions of the silicon substrate 300 positioned between the bulb-type third trenches 132 are isolated by the oxide layers 150.

Figure 6:
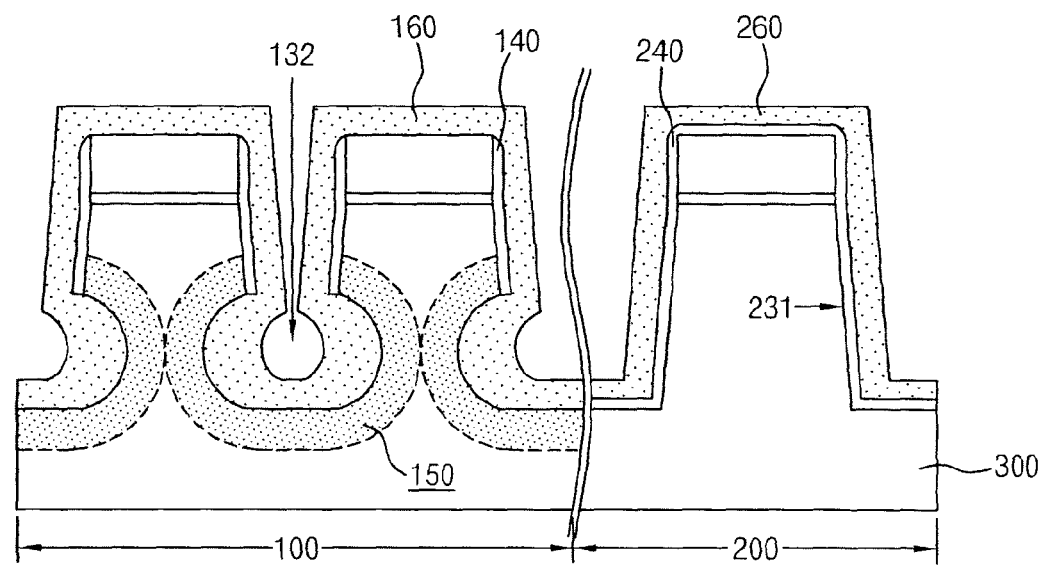

Referring to FIG. 6, first insulation layers 160 and 260 are formed at a uniform thickness on the surfaces of the bulb-type third trenches 132 in the first region 100 (the first region having the oxide layers 150 formed in the surfaces of the spherical lower portions), the second trenches 231 in the second region 200, on the upper surfaces of the first hard mask patterns 121, and on the portion of the etch barrier layer 140 which is formed on the upper surface of the second hard mask pattern 221. The first insulation layers 160 and 260 can comprise an oxide layer. The first insulation layers 160 and 260 are formed to a thickness capable of filling the spherical lower portions of the bulb-type second trenches 132, which are defined in the first region 100. That is, for example, in the embodiment of the present invention shown in FIG. 6, the spherical portion on the left side of the cross-section of a bulb-type trench and the spherical portion on the right side of the cross-section of the bulb-type trench are filled with the first insulation layers 160 and 260 (although the portion between the two spherical portions does not necessarily have to be filled).

Figure 7:
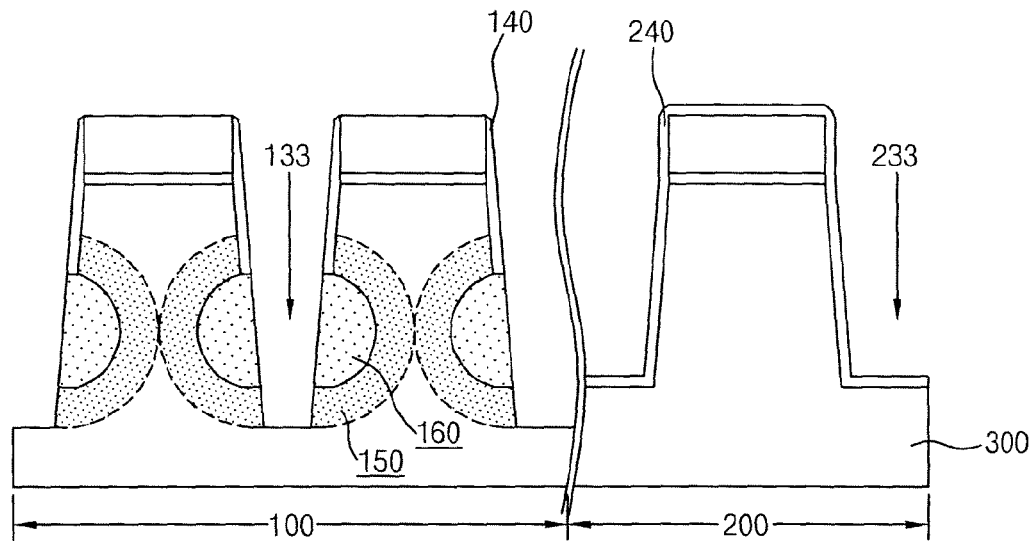

Referring to FIG. 7, isolation trenches 133 and 233 are defined in the first region 100 and the second region 200 by anisotropically etching the first insulation layers 160 and 260. In the embodiment shown in FIG. 7, for example, the spherical portions of a bulb-type trench remain filled with the first insulation layer 160, while the remaining portions of the bulb type trench, including the portion between the spherical portions, is removed to form the isolation trench 133.

Figure 8:
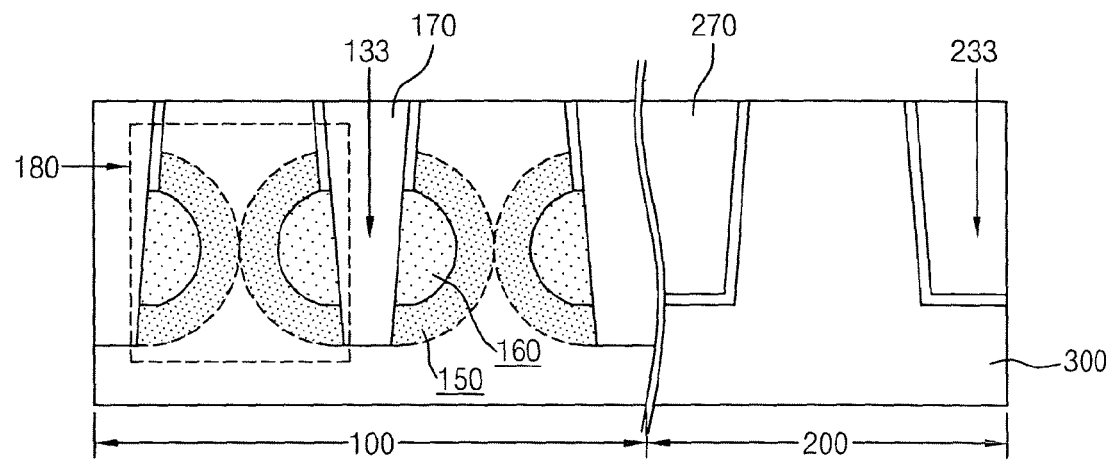

Referring to FIG. 8, a second insulation layer is formed to fill the isolation trenches 133 and 233, and then the second insulation layer is removed through a chemical mechanical polishing (CMP) process until the first and second hard mask patterns 121 and 221 are exposed. Then, by removing the first and second hard mask patterns 121 and 221, isolation structures 170 and 270 are respectively formed in the first and second regions 100 and 200 to define active regions.

The active region of the first region 100 has an SOI structure 180 in which the oxide layer 150 and the first insulation layer 160 are interposed between portions of the silicon substrate 300.

Thereafter, while not shown in the drawings, by sequentially conducting a series of well-known subsequent processes, the manufacture of a semiconductor device according to the embodiment of the present invention is completed.

As is apparent from the above description, in the present invention, after defining bulb-type third trenches in a first region, an oxide layer is formed on the surfaces of the spherical portions of the bulb-type third trenches through an oxidation process. Accordingly, in the present invention, the fact that a portion of a silicon substrate positioned between adjoining bulb-type third trenches is isolated by the oxide layer allows an SOI structure to be selectively formed only in the first region.

As a result, in the present invention, an SOI structure can be formed only in a desired region, whereby it is possible to realize a semiconductor device capable of satisfying various purposes on a single silicon substrate.

Although a specific embodiment of the present invention has been described for illustrative purposes, those skilled in the art will appreciate that various modifications, additions and substitutions are possible, without departing from the scope and the spirit of the invention as disclosed in the accompanying claims.

What is claimed is:

1. A method for manufacturing a semiconductor device, comprising the steps of:
   forming hard mask patterns on the silicon substrate such that isolation areas are exposed;
   etching the exposed isolation areas of the silicon substrate to define trenches;
   forming an etch barrier layer comprising a nitride layer on sidewalls of the trenches;
   isotropically etching bottom portions of the trenches using the etch barrier layer and the hard mask patterns as an etch mask to form the spherical portions;
   defining bulb-type trenches having spherical portions in a silicon substrate;
   conducting an oxidation process to form oxide layers in surfaces of the spherical portions of the bulb-type trenches;
   forming an insulation layer on the silicon substrate including surfaces of the bulb-type trenches having the oxide layers formed therein; and
   etching the insulation layer to define isolation trenches, wherein the insulation layer is etched such that a portion of the insulation layer remains in the spherical portions of the bulb-type trenches, and
   wherein SOI structures having the oxide layers interposed between portions of the silicon substrate are formed.

2. The method according to claim 1, wherein the hard mask patterns comprise a stack including an oxide layer and a nitride layer.

3. The method according to claim 1, wherein the oxidation process is conducted such that the oxide layers formed in the surfaces of the spherical portions of any two adjoining bulb-type trenches come into contact with each other or overlap each other.

4. The method according to claim 1, wherein the insulation layer is formed to a thickness such that the spherical portions of the bulb-type trenches are filled.

5. The method according to claim 1, wherein the insulation layer comprises an oxide layer.

6. The method according to claim 1, wherein the etching of the insulation layer is conducted as anisotropic etching.

7. The method according to claim 1, further comprising the step of:
   after the step of defining the isolation trenches, filling an insulation layer in the isolation trenches to form isolation structures.

8. A method for manufacturing a semiconductor device, comprising the steps of:
   defining first trenches in isolation areas of a first region of a silicon substrate and defining second trenches in isolation areas of a second region of the silicon substrate;
   forming etch barrier layers comprising nitride layer on sidewalls of the first and second trenches;
   isotropically etching bottom portions of the first trenches to define spherical portions such that bulb-type third trenches that include the first trenches and the spherical portions are formed;
   conducting an oxidation process to form oxide layers in surfaces of the spherical portions of the bulb-type third trenches;
   forming an insulation layer on the first and second regions of the silicon substrate including the bulb-type third trenches of the first region and the second trenches of the second region; and
   etching the insulation layer to define isolation trenches in the first region and the second region, wherein the insulation layer in the first region is etched such that a portion of the insulation layer remains in the spherical portions of the bulb type trenches, and
   wherein SOI structures having the oxide layers interposed between portions of the silicon substrate are formed in the first region.

9. The method according to claim 8, wherein the first region corresponds to a cell region, and the second region corresponds to a peripheral region.

10. The method according to claim 8, wherein the step of defining the first trenches in the first region and the second trenches in the second region comprises the steps of:
    forming a hard mask layer on the silicon substrate;
    etching portions of the hard mask layer formed in the second region to form a second hard mask pattern that exposes isolation areas of the second region;
    etching the exposed isolation areas of the second region;
    etching portions of the hard mask layer formed in the first region to form a first hard mask patter that exposes isolation areas of the first region; and
    etching the exposed isolation areas of the first region and the already etched isolation areas of the second region.

11. The method according to claim 10, wherein the hard mask layer comprises a stack including an oxide layer and a nitride layer.

12. The method according to claim 8, wherein the second trenches of the second region are defined at a depth deeper than that of the first trenches of the first region.

13. The method according to claim 8, wherein the oxidation process is conducted such that the oxide layers formed in the surfaces of the spherical portions of any two adjoining bulb-type third trenches come into contact with each other or overlap each other.

14. The method according to claim 8, wherein the insulation layer is formed to a thickness such that the spherical portions of the bulb-type third trenches are filled.

15. The method according to claim 8, wherein the insulation layer comprises an oxide layer.

16. The method according to claim 8, wherein the etching of the insulation layer is conducted as anisotropic etching.

17. The method according to claim 8, further comprising the step of:
after the step of defining the isolation trenching in the first region and second region, filling an insulation layer in the isolation trenches to form isolation structures.

* * * * *